United States Patent [19]
Tanaka et al.

[11] Patent Number: 5,514,992
[45] Date of Patent: May 7, 1996

[54] LOW-DISTORTION CASCODE CIRCUIT

[75] Inventors: Satoshi Tanaka; Akishige Nakajima, both of Kokubunji; Eiichi Hase, Iruma; Chushiro Kusano, Tokorozawa, both of Japan

[73] Assignee: Hitachi, Ltd., Tokyo, Japan

[21] Appl. No.: 273,800

[22] Filed: Jul. 12, 1994

[30] Foreign Application Priority Data

Jul. 20, 1993 [JP] Japan .................... 5-178793

[51] Int. Cl.$^6$ ................ H03B 19/00; H03K 3/353
[52] U.S. Cl. ................ 327/317; 327/355; 327/408; 327/566; 455/333
[58] Field of Search ............... 327/355, 356, 327/358, 407, 408, 434, 436, 437, 379, 389, 113, 116, 317, 566, 544, 317; 326/17, 34; 455/333

[56] References Cited

U.S. PATENT DOCUMENTS

| | | | |
|---|---|---|---|
| 4,430,583 | 2/1984 | Shoji | 326/102 |
| 4,541,122 | 9/1985 | Kimura | 455/333 |
| 4,563,772 | 1/1986 | Beneking et al. | 455/333 |
| 4,760,293 | 7/1988 | Hebenstreit | 327/434 |
| 4,814,649 | 3/1989 | Young | 327/113 |
| 4,841,169 | 6/1989 | Tsironis | 327/566 |
| 4,902,921 | 2/1990 | Hiramoto et al. | 327/434 |
| 5,016,077 | 5/1991 | Sato et al. | 327/437 |
| 5,083,050 | 1/1992 | Vasile | 327/113 |
| 5,099,143 | 3/1992 | Arakawa | 327/408 |
| 5,306,969 | 4/1994 | Kimura | 327/113 |

OTHER PUBLICATIONS

IEEE Transactions On Electron Devices, vol. ED–25, Jun. 1978, "GaAs Dual–Gate MESFET's", pp. 580–586.

*Primary Examiner*—Terry Cunningham
*Assistant Examiner*—Terry L. Englund
*Attorney, Agent, or Firm*—Fay, Sharpe, Beall, Fagan, Minnich & McKee

[57] ABSTRACT

An electronic circuit is provided with a first field effect transistor and a second field effect transistor, in which a drain of the first field effect transistor connected to a source of the second field effect transistor. This electronic circuit inputs a first signal to a gate electrode of the first field effect transistor, inputs a second signal to a gate electrode of the second field effect transistor and outputs a signal from a drain of the second field effect transistor. This electronic circuit is a cascode circuit related to the current drivability of the second field effect transistor is set to be larger than the current drivability of the first field effect transistor, and there is an effect that third-order or higher order distortion characteristics of a cascode type or dual-gate circuit can be reduced.

7 Claims, 8 Drawing Sheets

PRIOR ART

LOW-DISTORTION CASCODE CIRCUIT

BACKGROUND OF THE INVENTION

The present invention relates to a low-distortion cascode circuit for high-frequency communications, and relates more particularly to a low-distortion cascode circuit corresponding to a frequency converter or an amplifier of excellent low-distortion characteristics.

As a frequency converter (mixer) for a communication unit, a cascode circuit using a dual-gate field effect transistor (hereinafter to be referred to as a FET) has been widely known. An example of the conventional dual-gate FET is disclosed in the "GaAs Dual-Gate MESFETS's IEEE, Trans. Electron Devices, vol. ED-25, pp. 580–586", issued in June 1978.

The above-described prior-art technique is characterized in that the dimensions of two FETs are set the same. The prior-art dual-gate FET can be considered to be the cascode configuration of the FETs having almost the same electric characteristics.

The outline of a dual-gate FET which is operated as a frequency converter will be explained with reference to FIG. 6. Equivalent circuits of the dual-gate FET are shown as a cascode connection of two FETs 1 and 2. When the dual-gate FET is operated as a down-converter (mixer), an RF signal is applied to the gate of the lower-stage FET 1 from a terminal 5. A local signal is applied to the gate of the upper-stage FET 2 from a terminal 4.

Functions of the FETs 1 and 2 will be explained below. The FET 1 functions as a voltage control type resistor which is modulated by an RF signal applied to the gate. The FET 2 has two functions. One is the function of a source follower for applying a local signal to the resistor. Since a local signal is applied to the resistor that has been modulated by the RF signal, a component of a product of both signals occurs in a current Id that flows through the resistor, so that a mixing function is achieved. The other function of the FET 2 is the function of an amplifier of a gate ground type. The current Id that flows through the resistor is outputted from the drain.

SUMMARY OF THE INVENTION

As described above, according to the prior-art technique, dimensions of the gates of the two FETs are set to be the same. There is also an example that the gate length of the second FET is set to be longer to have an improved breakdown voltage. This, however, has a problem that there is a risk of an occurrence of a distortion characteristic such as a third-order harmonic distortion, because the second FET cannot operate as an ideal source follower or an ideal gate ground type amplifier as described above.

In order to identify the problems, an ideal operation will be compared with an actual operation, by taking an example that the first FET is being operated in a triode region. Assuming that a gate bias is expressed as $Vg1$, a drain bias is expressed as $Vd1$, a transconductance is expressed as $b1$ and a threshold voltage is expressed as $Vth$, then a drain current $Id1$ is given as follows:

$$Id1 = b1(Vg1 - Vth)Vd1 - 0.5Vd1^2 \quad \text{(Expression 1)}$$

where, "^2" represents a square. Assume that the FET 2 has operated as an ideal source follower and an ideal ground type amplifier. When a gate voltage and a drain current of the FET 2 are $Vg2$ and $Id2$, respectively, the following relations are obtained:

$$Id2 = Id1 \quad \text{(Expression 2)}$$

$$Vg2 - Vth = Vd1 \quad \text{(Expression 3)}$$

From the expressions 1, 2 and 3, the following relation is obtained:

$$Id2 = B1(Vg1 - Vth)(Vg2 - Vth) - 0.5(Vg2 - Vth)^2 \quad \text{(Expression 4)}$$

A term of $b1*Vg1*Vg2$ functions as a down converter. In the expression 4, there is no third-order or higher-order term relating to $Vg1$.

In comparison with the above, an actual operation of the FET 2 will be considered. Assuming that the FET 2 is being saturation operated, the following relation exists:

$$Id2 = b2(Vg2 - Vd1 - Vth)2 \quad \text{(Exrpession 5)}$$

Based on the above expression, there is the following relation between $Vd1$ and the local $Vg2$:

$$Vd1 = Vg2 - Vth - SQRT(Id2/b2) \quad \text{(Expression 6)}$$

Based on the fact that the expression 2 is also established when the operation is not ideal and based on the expression 1, the following relation exists:

$$Id2 = b1(Vg1 - Vth)(Vg2 - Vth - SQRT(Id2/b2)) - 0.5(Vg2 - Vth - SQRT(Id2/b2))^2 \quad \text{(Expression 7)}$$

While detailed modification of the expression 7 will be omitted to avoid a complexity, because of the existence of the term "$-SQRT(Id2/b2)$" in the expression 7, a third-order or higher-order term relating to $Vg1$ will occur in the expression 7.

A frequency converter has been taken in the above as an example of the application of the cascode circuit. When the cascode circuit is applied as an amplifier in which the FET 1 saturation operates, a third-order term will also occur as shown below although the term is not so extreme as in the case of the frequency converter.

$$Id2 = b1(Vg1 - Vth)^2(1 + lambda(Vg2 - Vth\ SQRT(Id2/b2))) \quad \text{(Expression 8)}$$

According to the prior-art dual-gate FET, $b1 = b2$. In the second FET of which gate length has been made larger to improve the breakdown voltage, $b1 > b2$. According to the above-described dual-gate FET, there has been a problem that there arises a significant influence of a third-order distortion as shown in the expression 7. It is an object of the present invention to provide a low-distortion cascode circuit in which the influence of the third-order distortion is minimized.

In order to achieve the above object, the low-distortion cascode circuit according to the present invention includes a first FET and a second FET, and the drain of the first FET is connected with the source of the second FET, a first signal is inputted to the gate electrode of the first FET, a second signal is inputted to the gate electrode of the second FET and a signal is taken out from the drain of the second FET, to form an electronic circuit, wherein the current drivability of the second FET is larger than the current drivability of the first FET. From a functional viewpoint, the above object can be achieved by setting the above-described $b2$ to be larger and bringing the operation of the FET 2 to closer to the operation of an ideal source follower and an ideal gate ground type amplifier.

When $b2$ is made to be larger, the current drivability of the FET 2 is increased straight. Methods for increasing the current drivability of the FET 2 by using many means will be explained in the following embodiments.

DESCRIPTION OF THE PREFERRED EMBODIMENTS

A first embodiment of the present invention will be explained with reference to FIGS. 1A to 1C. Of two cascode-connected FETs, a transconductance b2 of the upper-stage FET is set to be larger than a transconductance b1 of the lower-stage FET, to restrict a term of a third-order distortion or a higher-order distortion expressed by the expression 7. Setting b2 to be larger is nothing but increasing the current drivability of the FET 2.

Figure 1A:
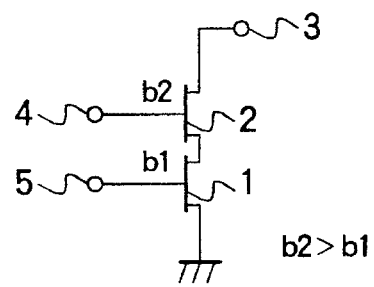
FIGS. 1A to 1C show a first embodiment of the present invention.
Figure 1B:
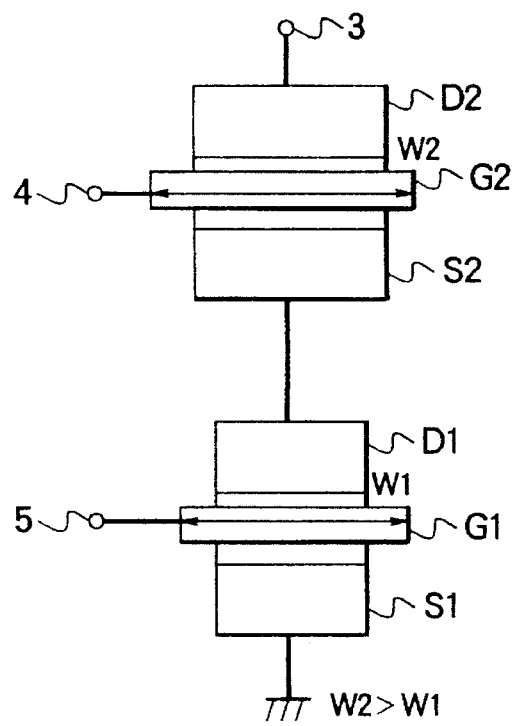
Figure 1C:
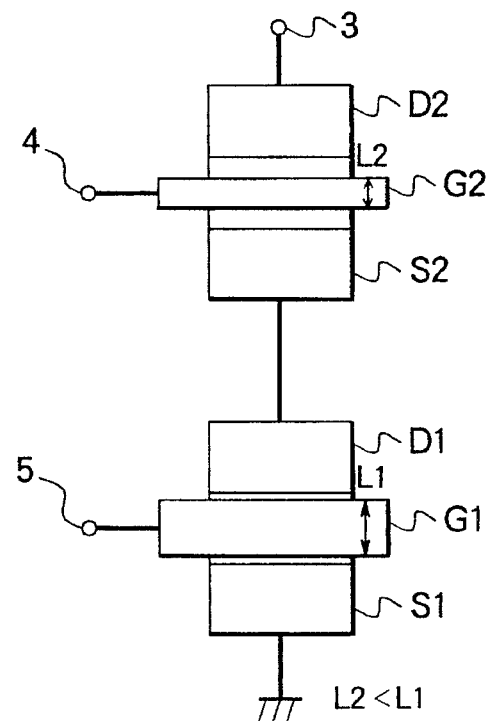

As shown in FIGS. 1A to 1C, the present invention provides an electronic circuit, including a first FET 1 and a second FET 2, according to which, a drain of the first FET 1 is connected with a source of the second FET 2, a first signal is inputted to a gate electrode of the first FET from a terminal 5, a second signal is inputted to the second FET from a terminal 4, and a signal is taken out from a drain of the second FET 2 to a terminal 3, wherein the current drivability of the second FET 2 is set to be larger than the current drivability of the first FET 1.

Methods for increasing the current drivability of the FET 2 by using many means in the embodiment will be explained below.

There are various methods for practically achieving b2>b1, such as, for example, setting a gate width W2 of the FET 2 to be larger than a gate width W1 of the FET 1 (reference FIG. 1B), setting a gate length L2 of the FET 2 to be shorter than a gate length L1 of the FET 1 (reference FIG. 1C), etc. D1 and D2 designate drains of the respective FETs, S1 and S2 designate sources of the respective FETs and G1 and G2 designate gates of the respective FETs.

Figure 2A:
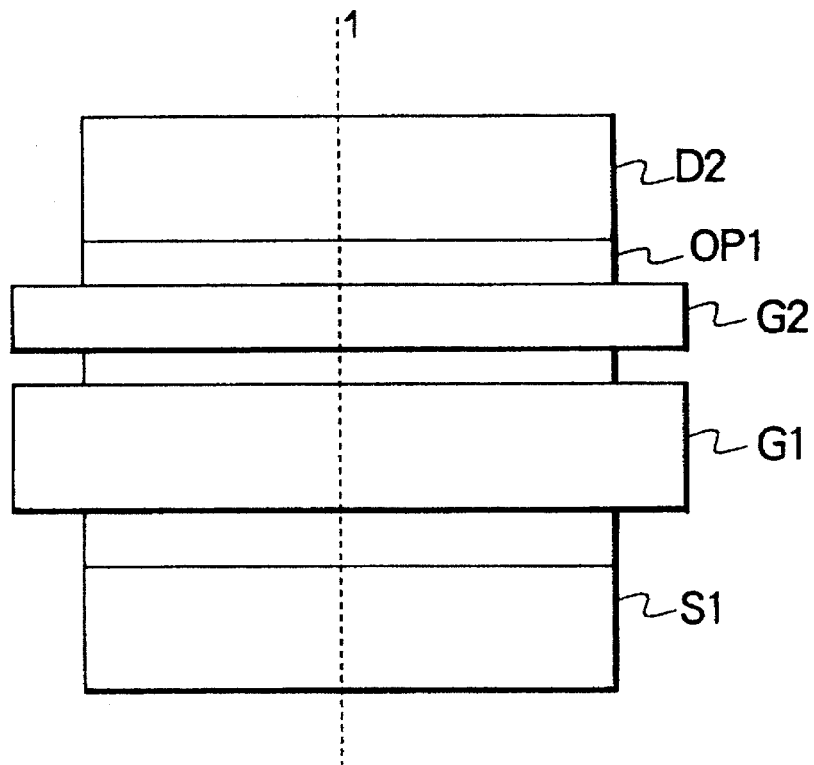
FIGS. 2A and 2B show a second embodiment of the present invention.
Figure 2B:
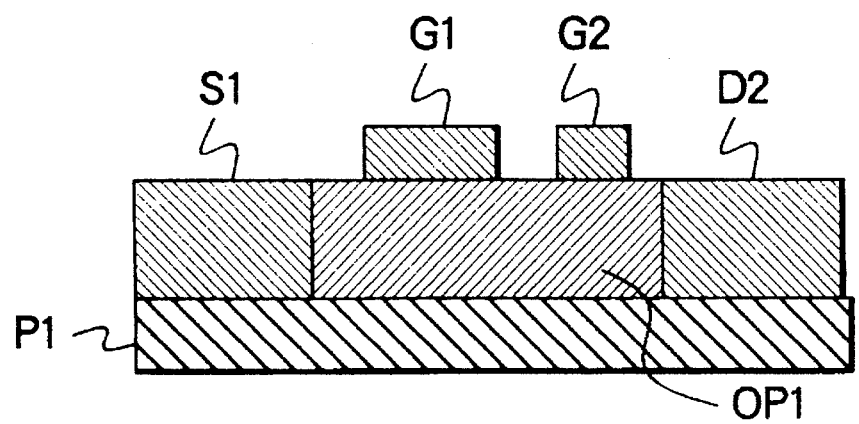

A second embodiment of the present invention will be explained below with reference to FIGS. 2A and 2B. The present embodiment shows the case that the cascode circuit is applied to the dual-gate FET and the lengths of the two gates G1 and G2 are differentiated to achieve b2>b1. The present embodiment is superior to the embodiment shown in FIGS. 1A and 1C using the two FETs, in the chip area saving function when the circuit is integrated. FIG. 2A is a top plan view of the device and FIG. 2B is a cross-sectional view viewed from 1. P1 designates a substrate and OP1 designates a channel.

Figure 3:
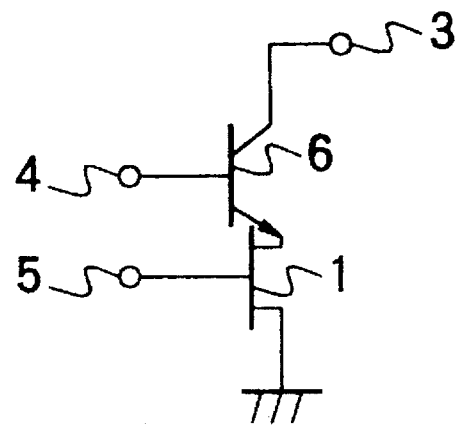
FIG. 3 shows a third embodiment of the present invention.

A third embodiment of the present invention will be explained with reference to FIG. 3. The present embodiment is an improvement of the current drivability and a reduction of a distortion by replacing the second FET 2 with a bipolar transistor 6. Other structures are the same as the structures of the embodiment shown in FIGS. 1A and 1C.

Figure 4:
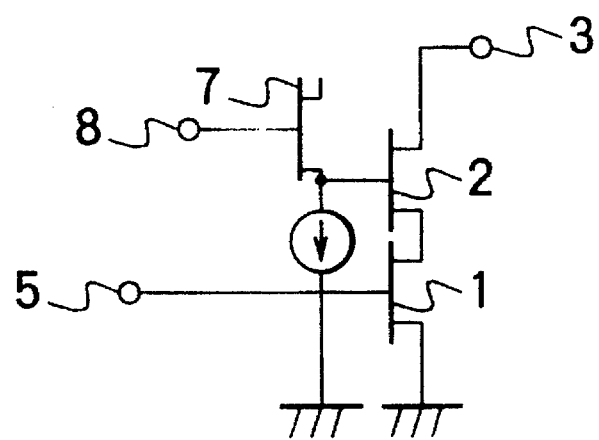
FIG. 4 shows a fourth embodiment of the present invention.

A fourth embodiment of the present invention will be explained with reference to FIG. 4. According to the present embodiment, a local input from a terminal 8 is supplied to the second FET 2 through a source follower FET 7 so that a distortion which occurs when a signal source impedance is high is restricted. An emitter follower may be used instead of the source follower. Other structures are the same as the structures of the embodiment of FIGS. 1A to 1C.

Figure 5:
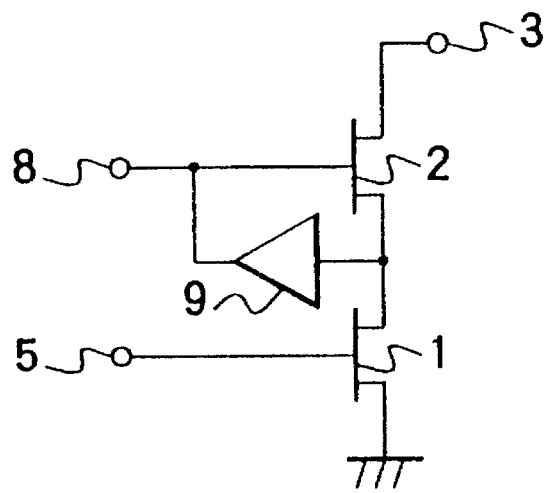
FIG. 5 shows a fifth embodiment of the present invention.
Figure 6:
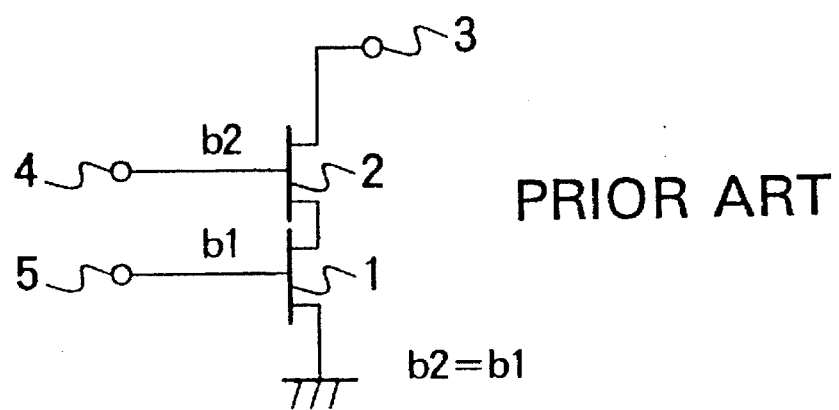
FIG. 6 shows a prior-art cascode circuit.

A fifth embodiment of the present invention will be explained with reference to FIG. 5. The present embodiment aims at a reduction of an impedance at the source side of the second FET 2 by adding a feedback circuit 9 between the source and the gate of the second FET 2. Other structures are the same as the structures of the embodiment of FIGS. 1A to 1C.

Figure 7A:
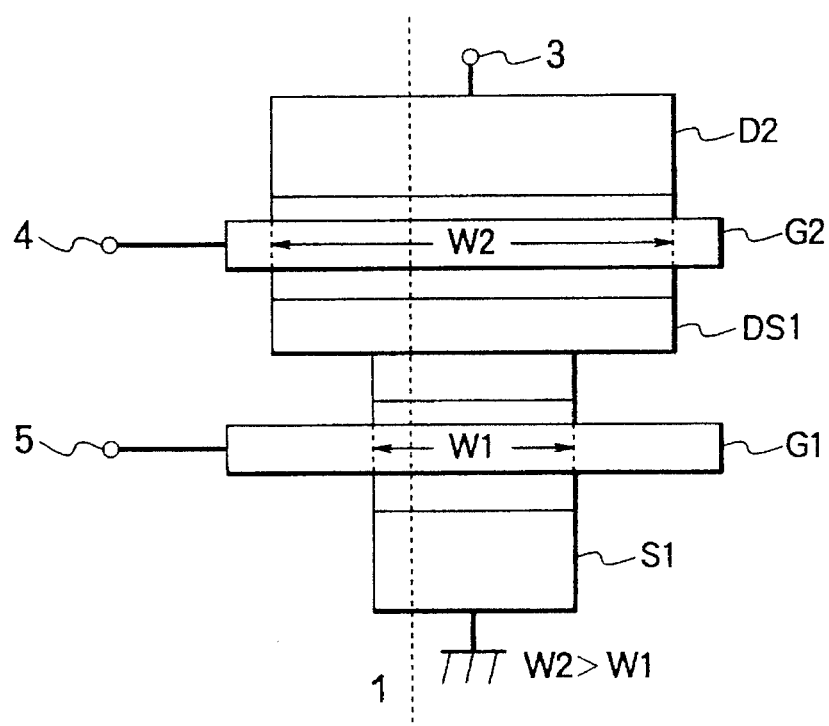
FIGS. 7A and 7B show a sixth embodiment of the present invention.
Figure 7B:
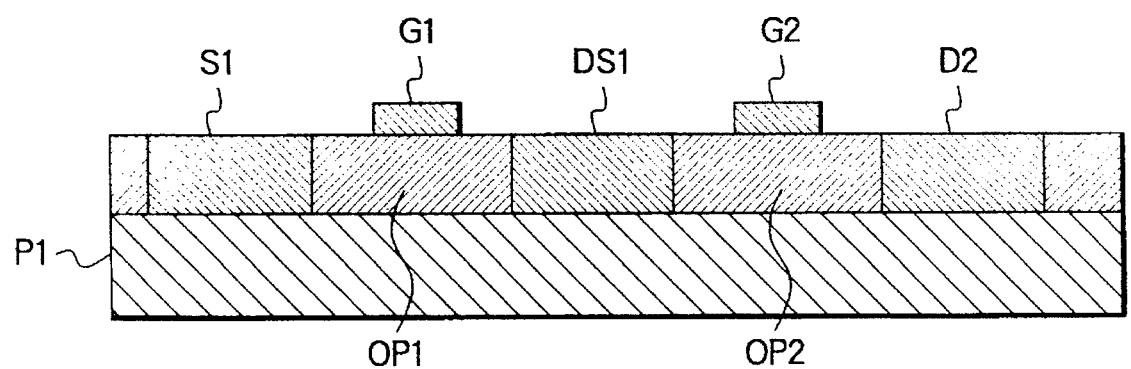

A sixth embodiment of the present invention will be explained with reference to FIGS. 7A and 7B. The present embodiment achieves the cascode-connected FET of the embodiment shown in FIGS. 1A to 1C by a dual-gate FET. The first FET 1 having a gate width W1 is cascode-connected with the second FET 2 having a gate width W2, to set W2 to be larger than W1. A region structuring the drain of the FET 1 and a region structuring the source of the FET 2 are set to be a common region DS1 to achieve a cascode circuit in small area. FIG. 7A is a top plan view of the device of the present embodiment and FIG. 7B is a cross-sectional view of FIG. 7A viewed from a broken line 1. D2 and G2 designate a drain and a gate respectively of the second FET 2, S1 and G1 designate a source and a gate respectively of the first FET 1, OP1 and OP2 designate channels and P1 designate a substrate.

Figure 8:
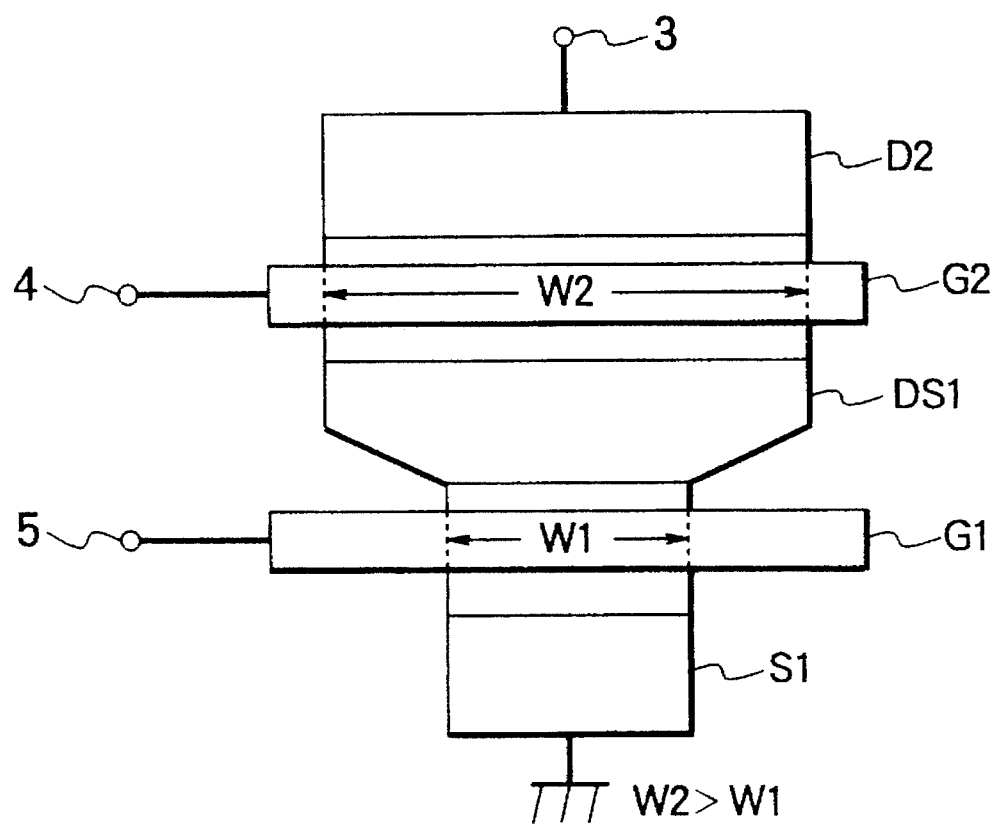
FIG. 8 shows a seventh embodiment of the present invention.

A seventh embodiment of the present invention will be explained with reference to FIG. 8. The present embodiment is an improvement to the dual-gate FET of the embodiment shown in FIGS. 7A and 7B. In the embodiment shown in FIGS. 7A and 7B, the region structuring the drain of the first FET 1 and the region structuring the source of the second FET 2 are connected by assuming the respective region widths as W1 and W2. In this case, when the difference between W1 and W2 is extreme, there is a problem that there arises a significant difference between the current paths which flow through both ends of the FETs and the current path which flows through the center of the FETs. In order to mitigate this problem, according to the present embodiment, the shape of the common region DS1 viewed from the top is set to be trapezoidal as shown in FIG. 8.

Figure 9A:
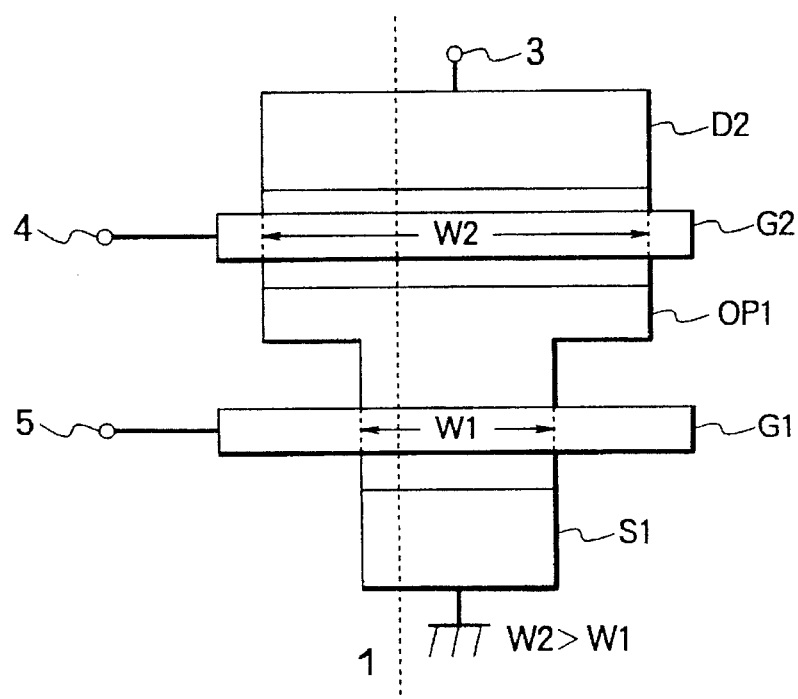
FIGS. 9A and 9B show an eighth embodiment of the present invention.
Figure 9B:
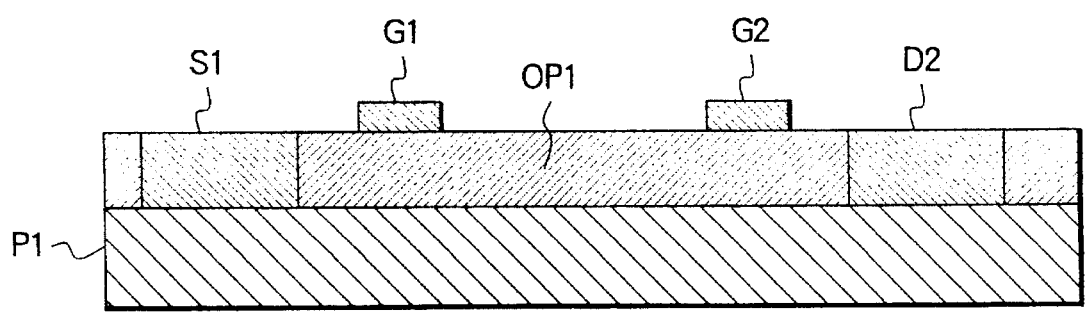

An eighth embodiment of the present invention will be explained with reference to FIGS. 9A and 9B. According to the present embodiment, the common region DS1 of the dual-gate FET of the embodiment shown in FIGS. 7A and 7B is removed and the channel OP1 is set to be common. By removing the common region DS1, the gate electrodes G1 and G2 can be set closer to each other so that the device is more compact than the device of the sixth embodiment.

Figure 10:
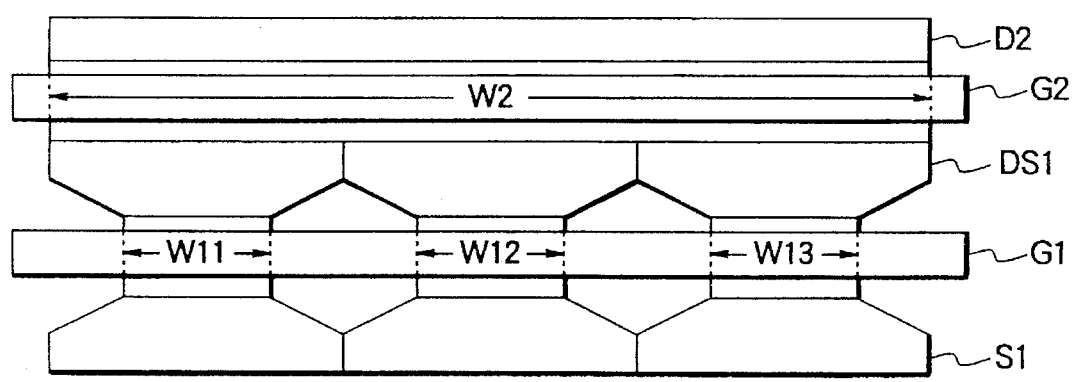
FIG. 10 shows a ninth embodiment of the present invention.

A ninth embodiment of the present invention will be explained below with reference to FIG. 10. The present embodiment corresponds to a structuring of the first FET 1 in the embodiment of FIG. 8 by parallel connecting a plurality of transistors having a small gate width. The region DS1 has a structure similar to the structure of the embodiment shown in FIG. 8. FIG. 10 shows an example of the structuring of the FET 1 by a parallel connection of three FETs. The gate width W1 of the first FET 1 is given by W1=W11+W12+W13. By structuring the FET 1 in a parallel connection of a plurality of FETs as described above, a distortion of the current path when there is an extreme difference between W1 and W2 can be reduced. Although the present embodiment has been explained to have three FETs to structure the first FET 1, it is needless to mention that a similar effect can also be obtained when the number of FETs to be used to structure the FET 1 is changed.

Figure 11:
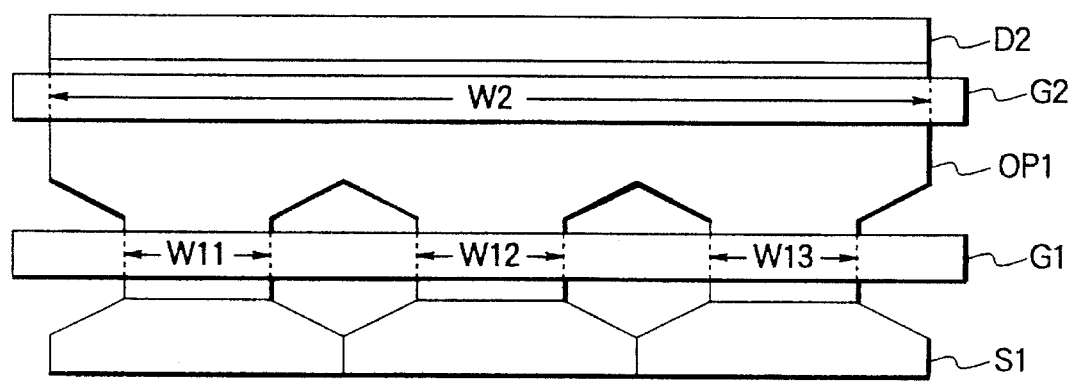
FIG. 11 shows a tenth embodiment of the present invention.

A tenth embodiment of the present invention will be explained with reference to FIG. 11. The present embodiment corresponds to the embodiment of FIG. 10 where the structure of the region DS1 is set similar to the structure of the embodiment shown in FIG. 9. The present embodiment relates to the feature that the gates G1 and G2 of the FET 1 and FET 2 exist on the same channel OP1.

In general, the channel OP1 has a larger resistance per unit area than the common region BS1 that structures source and drain electrodes, so that the channel OP1 is easily affected by non-uniform current paths. Therefore, the parallel configuration of the FET 1 has a large effect of improvement.

Although description has been made above of the case where a cascode circuit is applied to a mixer circuit, it is needless to mention that all the above-described embodiments can also function as a low-distortion cascode amplifier by AC grounding the local input unit.

The present invention has an effect of reducing third-order or higher-order distortion characteristics of a cascode type or dual-gate type frequency converter. The present invention can also function as a low-distortion cascode amplifier.

What is claimed is:

1. A low-distortion cascode circuit, comprising:
   a first field effect transistor and a second field effect transistor, with a drain of said first field effect transistor being connected to a source of said second field effect transistor;
   a first terminal for receiving a first signal, coupled to a gate electrode of said first field effect transistor;
   a second terminal for receiving a second signal, coupled to a gate electrode of said second field effect transistor; and
   a third terminal from which a signal from a drain of said second field effect transistor is output;
   wherein the transconductance of said second field effect transistor is larger than the transconductance of said first field effect transistor; and
   wherein a gate width of said second field effect transistor is larger than a gate width of said first field effect transistor.

2. A low-distortion cascode circuit according to claim 1, wherein said first and second field effect transistors together constitute a dual-gate field effect transistor., and wherein said drain of said first field effect transistor and said source of said second field effect transistor share a common region.

3. A low-distortion cascode circuit according to claim 2, wherein said common region has a trapezoidal shape as viewed from above.

4. A low-distortion cascode circuit according to claim 2, wherein said first and second field effect transistors share a channel.

5. A low-distortion cascode circuit according to claim 2, wherein said first field effect transistor further comprises a plurality of transistors connected in parallel.

6. A low-distortion cascode circuit comprising:
   a first field effect transistor and a second field effect transistor, with a drain of said first field effect transistor being connected to a source of said second field effect transistor;
   a first terminal for receiving a first signal, coupled to a gate electrode of said first field effect transistor;
   a second terminal for receiving a second signal, coupled to a gate electrode of said second field effect transistor; and
   a third terminal from which a signal from a drain of said second field effect transistor is output;
   wherein the transconductance of said second field effect transistor is larger than the transconductance of said first field effect transistor; and
   wherein a gate length of said second field effect transistor is shorter than a gate length of said first field effect transistor.

7. A low-distortion cascode circuit according to claim 6, wherein said first and second field effect transistors together constitute a dual-gate field effect transistor, said first gate and said second gate sharing a channel to have different gate widths.

* * * * *